(12) United States Patent
Schoenfeld et al.

(10) Patent No.: US 7,257,884 B2
(45) Date of Patent: Aug. 21, 2007

(54) METHOD FOR FABRICATING SEMICONDUCTOR COMPONENT WITH ADJUSTMENT CIRCUITRY FOR ELECTRICAL CHARACTERISTICS OR INPUT/OUTPUT CONFIGURATION

(75) Inventors: Aaron M. Schoenfeld, Boise, ID (US);
David J. Corisis, Nampa, ID (US);
Tyler J. Gomm, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/210,562

(22) Filed: Aug. 24, 2005

(65) Prior Publication Data
US 2006/0006551 A1    Jan. 12, 2006

Related U.S. Application Data

(62) Division of application No. 10/403,741, filed on Mar. 31, 2003, now Pat. No. 7,007,375, which is a division of application No. 10/140,340, filed on May 6, 2002, now Pat. No. 6,753,482.

(51) Int. Cl.
*H01H 69/02* (2006.01)
(52) U.S. Cl. .............. 29/623; 29/593; 29/830; 29/831; 29/832; 29/846; 29/847; 29/850; 29/884; 257/209; 257/E23.171; 361/778; 438/128; 438/131; 438/132
(58) Field of Classification Search ........... 29/623, 29/593, 830, 831, 832, 846, 847, 850, 884; 257/209, E23.171; 361/778; 438/128, 131, 438/132
See application file for complete search history.

(56) References Cited

U.S. PATENT DOCUMENTS

| | | | |
|---|---|---|---|
| 5,132,878 A | 7/1992 | Carey | |
| 5,200,580 A | 4/1993 | Sienski | |
| 5,264,729 A | 11/1993 | Rostoker et al. | |
| 5,301,143 A | 4/1994 | Ohri et al. | |
| 5,544,069 A | 8/1996 | Mohsen | |
| 5,691,209 A | 11/1997 | Liberkowski | |
| 5,914,524 A | 6/1999 | Komenaka | |
| 5,920,110 A | 7/1999 | Crafts et al. | |
| 5,937,515 A * | 8/1999 | Johnson .................. | 29/847 |
| 5,950,070 A | 9/1999 | Razon et al. | |
| 5,973,340 A | 10/1999 | Mohsen | |
| 5,982,185 A | 11/1999 | Farnworth | |
| 6,008,533 A | 12/1999 | Bruce et al. | |
| 6,157,584 A | 12/2000 | Holst | |
| 6,222,212 B1 | 4/2001 | Lee et al. | |

(Continued)

Primary Examiner—A. Dexter Tugbang
Assistant Examiner—Tim Phan
(74) Attorney, Agent, or Firm—Stephen A. Gratton

(57) ABSTRACT

A semiconductor component includes adjustment circuitry configured to adjust selected physical and electrical characteristics of the component or elements thereof, and an input/output configuration of the component. The component includes a semiconductor die, a substrate attached to the die, and terminal contacts on the substrate. The adjustment circuitry includes conductors and programmable links, such as fuses or anti-fuses, in electrical communication with the die and the terminal contacts. The adjustment circuit can also include capacitors and inductance conductors. The programmable links can be placed in a selected state (e.g., short or open) using a laser or programming signals. A method for fabricating the component includes the steps of forming the adjustment circuitry, and then placing the programmable links in the selected state to achieve the selected adjustment.

10 Claims, 6 Drawing Sheets

U.S. PATENT DOCUMENTS

| | | |
|---|---|---|
| 6,229,227 B1 | 5/2001 | Muthukumaraswamy et al. |
| 6,249,014 B1 | 6/2001 | Bailey |
| 6,277,674 B1 | 8/2001 | Wang et al. |
| 6,323,534 B1 | 11/2001 | Marr et al. |
| 6,333,887 B1 | 12/2001 | Vo |
| 6,348,400 B1 | 2/2002 | Schoenfeld |
| 6,351,040 B1 | 2/2002 | Schoenfeld |
| 6,391,681 B1 | 5/2002 | Corisis |
| 6,392,291 B1 | 5/2002 | Corisis |
| 6,425,766 B1 | 7/2002 | Panella |
| 6,449,170 B1 | 9/2002 | Nguyen et al. |
| 6,506,981 B1 | 1/2003 | Liberkowski |
| 6,528,735 B1 | 3/2003 | Bhatia et al. |
| 6,537,850 B1 | 3/2003 | Corisis |
| 6,649,931 B2 | 11/2003 | Honma et al. |
| 6,753,482 B1 | 6/2004 | Schoenfeld et al. |
| 6,914,275 B2 | 7/2005 | Schoenfeld et al. |
| 7,007,375 B2 | 3/2006 | Schoenfeld et al. |
| 2001/0031909 A1 | 10/2001 | Faltys et al. |

* cited by examiner

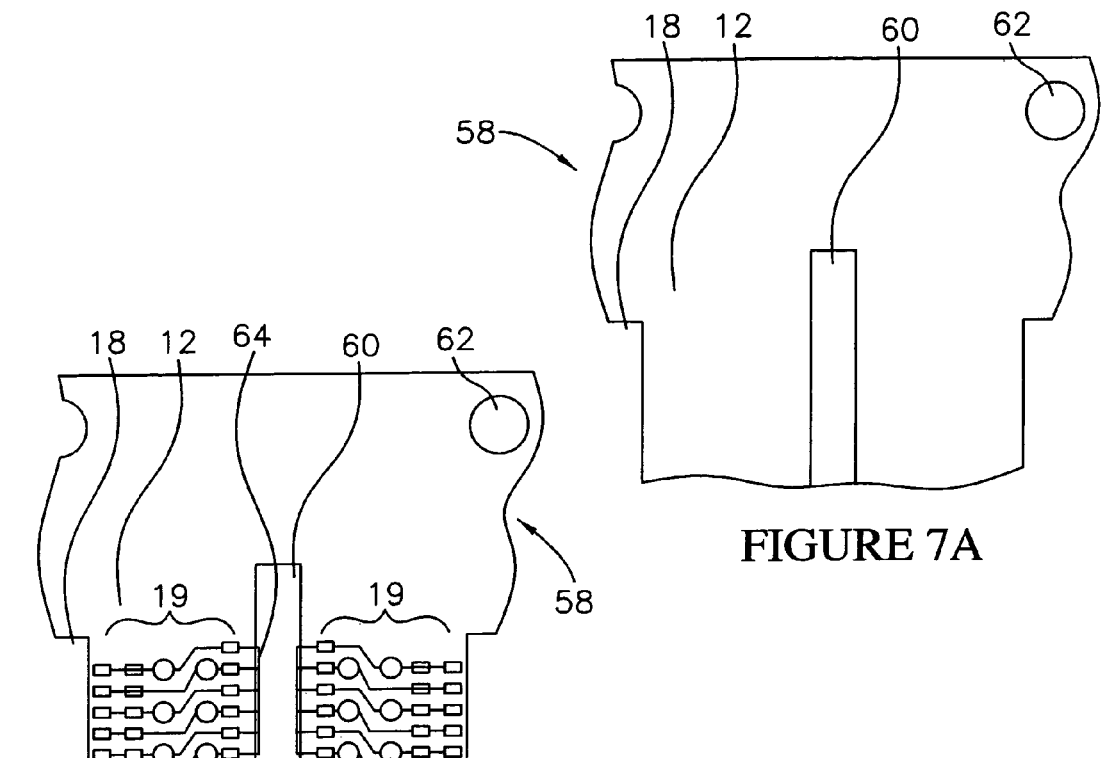
FIGURE 7A
FIGURE 7B
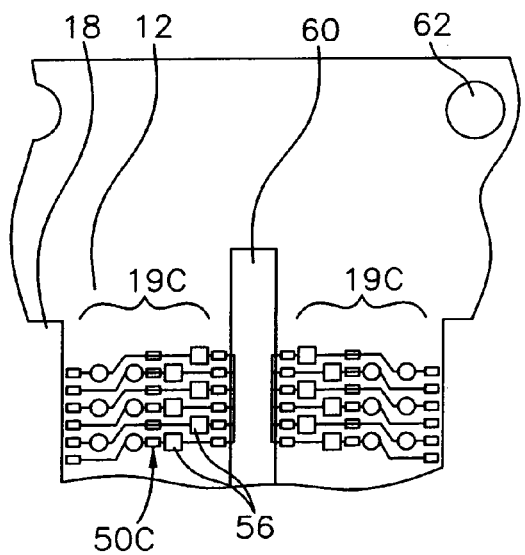
FIGURE 7C
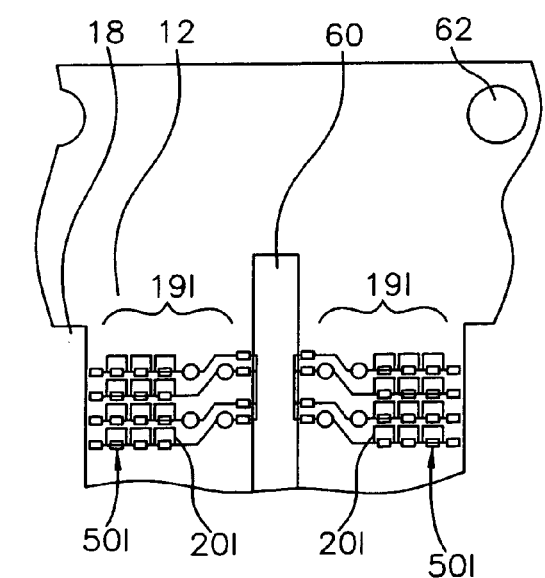
FIGURE 7D

METHOD FOR FABRICATING SEMICONDUCTOR COMPONENT WITH ADJUSTMENT CIRCUITRY FOR ELECTRICAL CHARACTERISTICS OR INPUT/OUTPUT CONFIGURATION

CROSS REFERENCE TO RELATED APPLICATIONS

This application is a division of Ser. No. 10/403,741, filed Mar. 31, 2003, U.S. Pat. No. 7,007,375, which is a division of Ser. No. 10/140,340, filed May 6, 2002, U.S. Pat. No. 6,753,482.

This application is related to Ser. No. 10/745,040, filed Dec. 22, 2003, U.S. Pat. No. 6,914,275.

FIELD OF THE INVENTION

This invention relates generally to semiconductor manufacture, and more particularly to an improved semiconductor component having adjustable characteristics and configurations. This invention also relates to a method for fabricating the component, and to systems incorporating the component.

BACKGROUND OF THE INVENTION

Semiconductor components, such as chip scale packages, ball grid array (BGA) devices, flip chip devices, and bare dice include terminal contacts, such as contact balls, contact bumps or contact pins. The terminal contacts provide the input/output configuration for a component, and permit the component to be surface mounted to a supporting substrate, such as a printed circuit board (PCB). Semiconductor components also include semiconductor dice, and the terminal contacts can be formed on substrates attached to the dice, or in some cases formed directly on the dice. For some components, such as chip scale packages, BGA devices, and bumped dice, the terminal contacts can be arranged in a dense grid array, such as a ball grid array (BGA), or a fine ball grid array (FBGA).

The terminal contacts are in electrical communication with integrated circuits, and other electrical elements, contained on the dice. Typically the components include patterns of conductors that provide separate electrical paths between the terminal contacts and the integrated circuits. The conductors can comprise metal traces formed on substrates attached to the dice, or formed directly on the dice. The physical and electrical characteristics of these conductors can affect the performance of the component, and the integrity of the signals transmitted through the terminal contacts to or from the integrated circuits on the component.

For example, plating buses are routinely used to electrically connect all of the conductors on a component during the fabrication process. The plating buses facilitate plating of bonding pads for the terminal contacts, and wire bonding pads for wire bonding the conductors to the dice. Following the plating process, the plating buses are trimmed, such that the conductors are no longer electrically connected to one another. However, portions of the plating buses can remain on some of the conductors following the trimming process. These remnant portions of the plating buses add mass and length to the conductors, which can affect electrical characteristics, such as inductance, capacitance and resistance. Other physical characteristics such as overall lengths, location on the component and proximity to other elements can also affect the electrical characteristics of the conductors.

The terminal contacts associated with the conductors will also have different electrical characteristics, and the characteristics of the signals transmitted through the terminal contacts will be different. These signal variations can adversely affect the operation of the integrated circuits on the components, particularly at high clocking speeds (e.g., 500 MHz or greater). It would be desirable to have the capability to adjust the electrical characteristics of the conductors and terminal contacts for semiconductor components, and of other elements of the components as well.

It would be also be advantageous to be able to adjust the electrical configuration of the components as well. For example, it may be necessary to electrically connect or disconnect different terminal contacts on a component to alter the input/output configuration of the component. This may be necessary because standardized components are often fabricated with different types of dice. As such, the configuration of the terminal contacts for a component containing a die with a ×4 pin assignment configuration may be different than the configuration required for the same component having a die with a ×16 pin assignment configuration. In the prior art different input/output configurations have been achieved by using different layouts for the terminal contacts and the conductors, or by using different wire bonding arrangements between the dice and the conductors.

Also in the prior art, fuses have been used for isolating defective circuitry and for substituting redundant circuitry on a component. For example, a 16 megabit DRAM memory die may have a small percentage of cells that fail following burn-in testing. Fuses can be used to isolate defective integrated circuitry, and to substitute redundant integrated circuitry. Fuses can be controlled using electrical signals, or by using a laser beam directed at a portion of the fuse.

Fuses have also been used in the art to lock in operating clock multipliers for microprocessor components. This type of microprocessor is manufactured by Advanced Micro Devices, Inc. of Sunnyvale, Calif., under the trademark "ATHLON".

The present invention provides a method for adjusting the characteristics of semiconductor components and elements thereof, and for customizing the input/output and electrical configuration of semiconductor components as well.

SUMMARY OF THE INVENTION

In accordance with the present invention, an adjustable semiconductor component, a method for fabricating the component, and electronic assemblies incorporating the component, are provided.

The component includes a substrate, a semiconductor die attached to the substrate, and terminal contacts on the substrate in electrical communication with the die. The component also includes adjustment circuitry on the substrate configured to adjust physical or electrical characteristics of the component or elements thereof.

The adjustment circuitry includes conductors in electrical communication with the integrated circuits on the die and with the terminal contacts. The adjustment circuitry also includes programmable links, such as fuses or anti-fuses, in electrical communication with the conductors. The programmable links are configured for placement into different states (e.g., short or open) using lasers or electronic signals.

Depending on the layout of the conductors and programmable links, different physical or electrical characteristics can be adjusted by the adjustment circuitry. For example, the adjustment circuitry can be configured to trim the conductors, such as to trim portions of plating buses associated with the conductors. In addition, the adjustment circuitry can include capacitors for adding capacitance to the conductors. Further, the adjustment circuitry can include conductive loops for adding inductance to the conductors.

The adjustment circuitry can also be used to change the input/output configuration of the terminal contacts, and thus the electrical configuration of the component. In this regard, standard substrates can be wired to different types of dice using a standardized wire bonding arrangement. The electrical paths to the terminal contacts can then be connected or disconnected using the conductors and the programmable links to achieve a desired input/output configuration. For example, memory dice can be wire bonded to the conductors at the widest configuration possible (e.g., sixteen DQs (×16). For a die having a sixteen DQs configuration (×16), no changes to the conductors are required. For a die having a four DQs configuration (×4), the programmable links can be configured to remove all of the conductors associated with the unused 12 DQs.

A method for fabricating the adjustable component can be performed on a strip, such as an organic leadframe, containing multiple substrates, which can be singulated into individual components. The method includes the step of forming the adjustment circuitry on the substrates by forming the conductors and the programmable links in a required layout. Depending on layout and elements, the adjustment circuitry can be configured to adjust different physical and electrical characteristics of the conductors, or the input/output configuration of the terminal contacts. The method also includes the step of placing the programmable links in a selected state (e.g., short or open) to connect or disconnect the conductors, and to achieve the desired adjustment. Depending on the type of programmable link, the placing step can be performed using a laser or electronic signals.

The component can be used to construct systems such as MCM packages, multi chip modules and circuit boards.

BRIEF DESCRIPTION OF THE DRAWINGS

FIG. 7A is a view taken along line 7A-7A of FIG. 6A illustrating a leadframe used in the method;

FIG. 7B is a view taken along line 7B-7B of FIG. 6B illustrating adjustment circuitry on the component of FIG. 4;

FIG. 7C is a view equivalent to FIG. 7B illustrating adjustment circuitry on the component of FIG. 4;

FIG. 7D is a view taken along line 7D-7D of FIG. 6B illustrating adjustment circuitry on the component of FIG. 5;

DETAILED DESCRIPTION OF THE PREFERRED EMBODIMENTS

Figure 1:
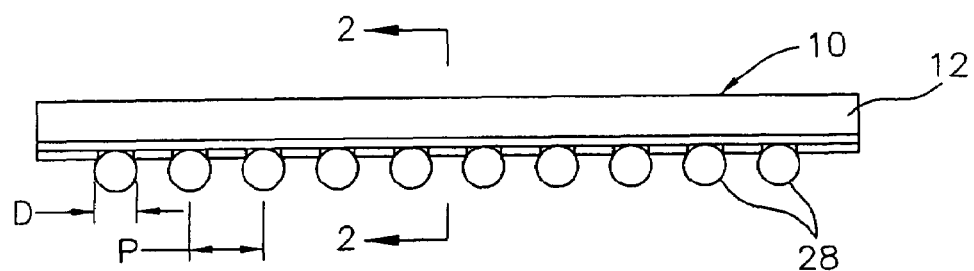
FIG. 1 is an enlarged schematic side elevation view illustrating a semiconductor component constructed in accordance with the invention with adjustable electrical characteristics.
Figure 2:
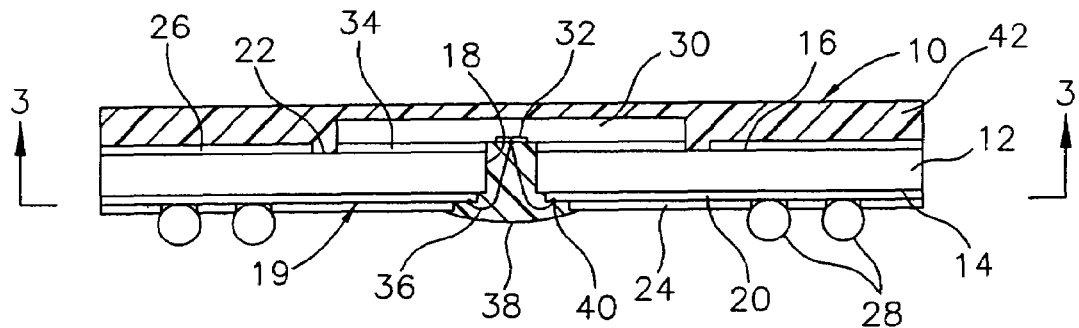
FIG. 2 is an enlarged cross sectional view of the component, taken along line 2-2 of FIG. 1.

Referring to FIGS. 1 and 2, a semiconductor component 10 constructed in accordance with the invention is illustrated. As used herein, the term "semiconductor component" refers to an element, or to an assembly, that includes a semiconductor die. In the illustrative embodiment, the component 10 comprises a board-on-chip (BOC) semiconductor package. However, the semiconductor component 10 can comprise another type of semiconductor package such as a chip-on-board (COB) package, a chip scale package (CSP), a BGA device, a flip chip device, or a bumped semiconductor die.

The component 10 includes a substrate 12 having a first surface 14 (FIG. 2), and an opposing second surface 16 (FIG. 2). The first surface 14, and the second surface 16, are the major planar surfaces of the substrate 12. The substrate 12 also includes a wire bonding opening 18 therethrough, extending from the first surface 14 to the second surface 16.

In addition, the substrate 12 includes adjustment circuitry 19 (FIG. 2) formed on the first surface 14 of the substrate 12, and a die attach area 22 formed on the second surface 16 of the substrate 12. The adjustment circuitry 19 includes a pattern of conductors 20 (FIG. 2), and programmable links 50A, 50B (FIG. 3) in electrical communication with the conductors 20.

The conductors 20 can comprise a highly conductive metal which is blanket deposited on the substrate 12, and then etched in required patterns. Alternately, an additive process, such as electroless deposition through a mask, can be used. Suitable metals for the conductors 20 include copper, aluminum, titanium, tungsten, tantalum, platinum, molybdenum, cobalt, nickel, gold, and iridium.

The substrate 12 can comprise an electrically insulating material, such as an organic polymer resin reinforced with glass fibers. Suitable materials for the substrate 12 include bismaleimide-triazine (BT), epoxy resins (e.g., "FR-4" and "FR-5"), and polyimide resins. These materials can be formed with a desired thickness, and then punched, machined, or otherwise formed with a required peripheral configuration, . and with required features. A representative thickness of the substrate 12 can be from about 0.2 mm to 1.6 mm.

The substrate 12 also includes a solder mask 24 on the first surface 14, and a solder mask 26 on the second surface 16. The solder masks 24, 26 can comprise a photoimageable dielectric material, such as a negative or positive tone resist.

As shown in FIG. 2, the component 10 includes an array of terminal contacts 28 on the substrate 12 in electrical communication with integrated circuits, or other electrical elements contained on the component 10. The terminal contacts 28 provide separate electrical connection points for transmitting (writing) and receiving (reading) electronic signals from the component 10. In addition, the terminal contacts 28 provide a structure for bonding the component 10 to a supporting substrate, such as a printed circuit board or module substrate.

In the illustrative embodiment, the terminal contacts 28 comprise generally spherically shaped contact balls in a ball grid array (BGA), or a fine ball grid array (FBGA). However, the terminal contacts 28 can comprise other conventional contacts having other shapes, and arranged in other patterns, to provide multiple electrical connection points for the component. By way of example, representative contacts include bumps, columns, studs, domes, cones, pins and pads. Also, the terminal contacts 28 can be made of any electrically conductive material, such as a solder alloy, copper, nickel, or a conductive polymer.

As shown in FIG. 1, the terminal contacts 28 have a diameter "D" and a spacing or pitch "P". With the terminal contacts 28 comprising contact balls in a ball grid array, or a fine ball grid array, a representative range for the diameter D can be from about 0.127 mm (0.005 inch) to 0.762 mm (0.030 inch). A representative range for the pitch P can be from about 0.228 mm (0.008 inch) to 2.0 mm (0.078 inch).

As shown in FIG. 2, the component 10 also includes a semiconductor die 30, and a die encapsulant 42 on the die 30 and on the second surface 16 of the substrate 12. The die 30 can comprise a conventional semiconductor die having a desired configuration. For example, the die 30 can comprise a dynamic random access memory (DRAM), a static random access memory (SRAM), a flash memory, a microprocessor, a digital signal processor (DSP), or an application specific integrated circuit (ASIC).

The die 30 includes a row of bond pads 32 formed on a face portion thereof, in electrical communication with the integrated circuits contained on the die 30. The die 30 is bonded face down to the die attach area 22 of the substrate 12, with the bond pads 32 on the die 30 aligned with the bonding opening 18 in the substrate 12.

As shown in FIG. 2, an adhesive layer 34 bonds the die 30 to the die attach area 22 on the substrate 12. The adhesive layer 34 can comprise a filled epoxy, an unfilled epoxy, an acrylic, a polyimide or an adhesive tape material. In addition, wires 36 are placed through the wire bonding opening 18 in the substrate 12, and are wire bonded to the bond pads 32 on the die 30, and to corresponding wire bonding pads 40 on the substrate 12. A wire bond encapsulant 38 fills the wire bonding opening 18 and encapsulates the wires 36. The wire bond encapsulant 38 can comprise a polymer material, such as a glob top of epoxy or silicone, deposited in a desired shape using a suitable process such as dispensing through a nozzle, and then cured as required.

Figure 3:
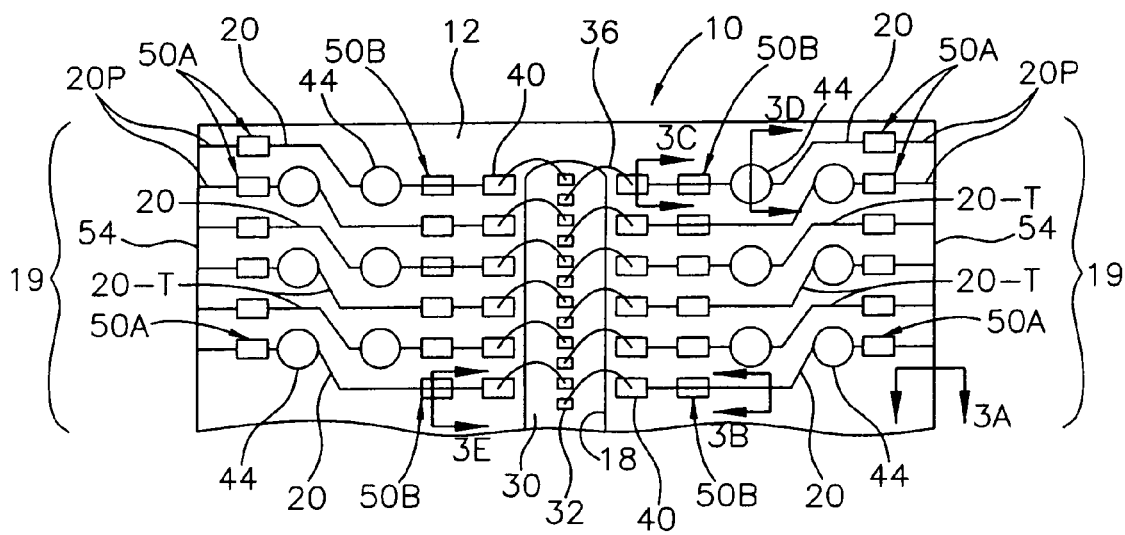
FIG. 3 is a partial, enlarged cross sectional view, taken along line 3-3 of FIG. 2, illustrating adjustment circuitry on the component.

Referring to FIG. 3, the adjustment circuitry 19 also includes terminal contact bonding pads 44 on the substrate 12 configured to provide bonding sites for bonding the terminal contacts 28 to the substrate 12. The terminal contact bonding pads 44 are in electrical communication with the conductors 20 and with the wire bonding pads 40. In addition, the terminal contact bonding pads 44 are in electrical communication with plating conductors 20P on the substrate 12 that extend to an edge 54 of the substrate 12. As will be further explained, the plating conductors 20P are initially connected to plating buses, which are used to apply a current to the terminal contact bonding pads 44, and to the wire bonding pads 40, for plating non-oxidizing metal layers 46 (FIGS. 3C and 3D) such as gold or platinum layers. These non-oxidizing metal layers 46 facilitate the bonding process for the terminal contacts 28 and the wire bonding process to the die 30.

Figure 3A:
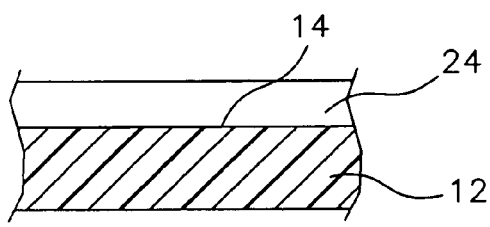
FIG. 3A is an enlarged cross sectional view, taken along line 3A-3A of FIG. 3, illustrating a substrate and solder mask of the component.
Figure 3B:
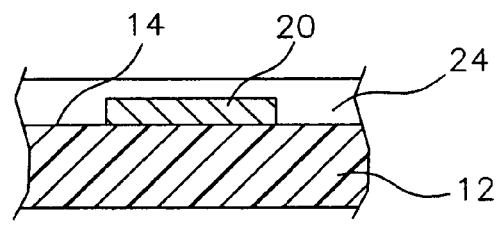
FIG. 3B is an enlarged cross sectional view, taken along line 3B-3B of FIG. 3, illustrating a conductor of the component.
Figure 3C:
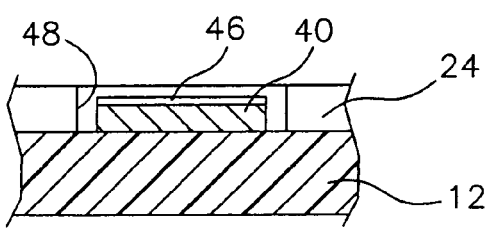
FIG. 3C is an enlarged cross sectional view, taken along line 3C-3C of FIG. 3, illustrating a wire bonding pad of the component.
Figure 3D:
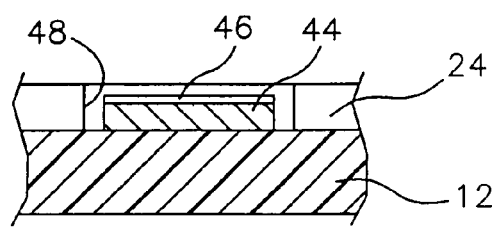
FIG. 3D is an enlarged cross sectional view, taken along line 3D-3D of FIG. 3, illustrating a bonding pad for a terminal contact of the component.

As shown in FIGS. 3A and 3B, the solder mask 24 covers the substrate 12 and the conductors 20. However, as shown in FIGS. 3C and 3D, the solder mask 24 includes openings 48 aligned with the wire bonding pads 40 and the terminal contact bonding pads 44.

As shown in FIG. 3, the adjustment circuitry 19 also includes first programmable links 50A proximate to the plating conductors 20P, and second programmable links 50B between the wire bonding pads 40 and the terminal contact bonding pads 44. As used herein the term "programmable link" means an element that can be placed in either a first state (short) in which electrical current can be transmitted through the link, or in a second state (open) in which electrical current cannot be transmitted through the link.

Suitable programmable links include laser fuses, current fuses, laser anti-fuses, and current anti-fuses. A laser fuse includes a segment that can be broken by a laser beam to create an open circuit. A voltage fuse includes a segment that can be broken by application of electrical current having a sufficient amperage to create an open circuit. A laser anti-fuse includes conductive segments separated by a dielectric layer that can be broken down by a laser beam to electrically connect the conductive segments to create a short circuit. A current anti fuse has a dielectric layer that can be broken down by application of electrical current having a sufficient amperage to create a short circuit.

In the embodiment illustrated in FIG. 3, the programmable links 50A, 50B comprise laser fuses which are initially fabricated in the first state (short), but which can be placed in the second state (open) by application of a laser beam. In FIG. 3 the programmable links 50A, 50B in the first state (short) have a continuous line therethrough, whereas the programmable links 50A, 50B in the second state (open) do not have a line therethrough.

Figure 3E:
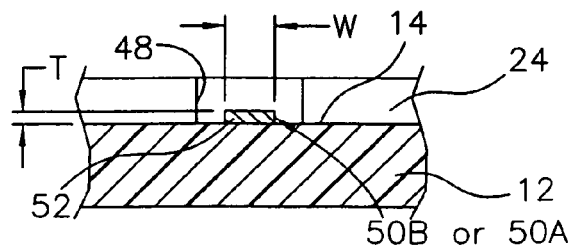
FIG. 3E is an enlarged cross sectional view, taken along line 3E-3E of FIG. 3, illustrating a programmable link of the component.

As shown in FIG. 3E, the programmable links 50A, 50B can comprise breakable segments 52 having a width W and a thickness T. The width W and the thickness T can be selected such that a laser beam of a predetermined power will sever a breakable segment 52. The breakable segments 52 can be formed of a same conductive material as the conductors 20, or can be formed of a different conductive material. In addition, the breakable segments 52 can be aligned with openings 48 in the solder mask 24 to permit access by the laser beam.

The programmable links 50A function as "trimming links" for trimming portions of the conductors 20. Specifically, in FIG. 3, the programmable links 50A have been placed in the second state (open) by application of a laser beam. This removes or "trims" the plating conductors 20P from the conductors 20. For simplicity, the programmable links 50A are illustrated in rows proximate to the outer edges 54 of the substrate 12. However, each programmable link 50A can be located as close as possible to a corresponding terminal contact bonding pad 44, such that as much length of the plating conductors 20P as is possible can be removed. Trimming of the plating conductors 20P improves the integrity of the signals transmitted to and from the terminal contacts 28 (FIG. 2) because the superfluous conductive path through the plating conductors 20P has been removed. In addition, the conductors 20 are more evenly matched in length, such that their electrical characteristics and signal transmitting capabilities are more evenly matched.

The programmable links 50B function as "input/output links" for changing the input/output configuration of the terminal contacts 28. Specifically, in FIG. 3, some of the programmable links 50B have been placed in the second state (open) by application of a laser beam, while some of the programmable links 50B remain in the first state (short). The programmable links 50B allow selected conductors 20, and their associated terminal contact bonding pads 44, to be removed or "trimmed" from the input/output circuit of the component 10. The trimmed conductors are designated 20-T. As such, there is no conductive path between a trimmed conductor 20-T and the die 30, and no conductive path between the die 30 and the terminal contact 28 (FIG. 2) associated with the trimmed conductor 20-T. This arrangement permits the input/output configuration of the terminal contacts 28 (FIG. 2) to be changed and customized for a particular application. The electrical configuration of the component 10 can thus be customized as well.

In addition, this arrangement permits the wire bonding of the die 30 to the conductors 20 to be standardized even for different types of dice. For example, a ×4 die can be wire bonded in the same manner as a ×16 die, but with the unused terminal contacts 28 taken out of the input/output circuit.

Figure 4:
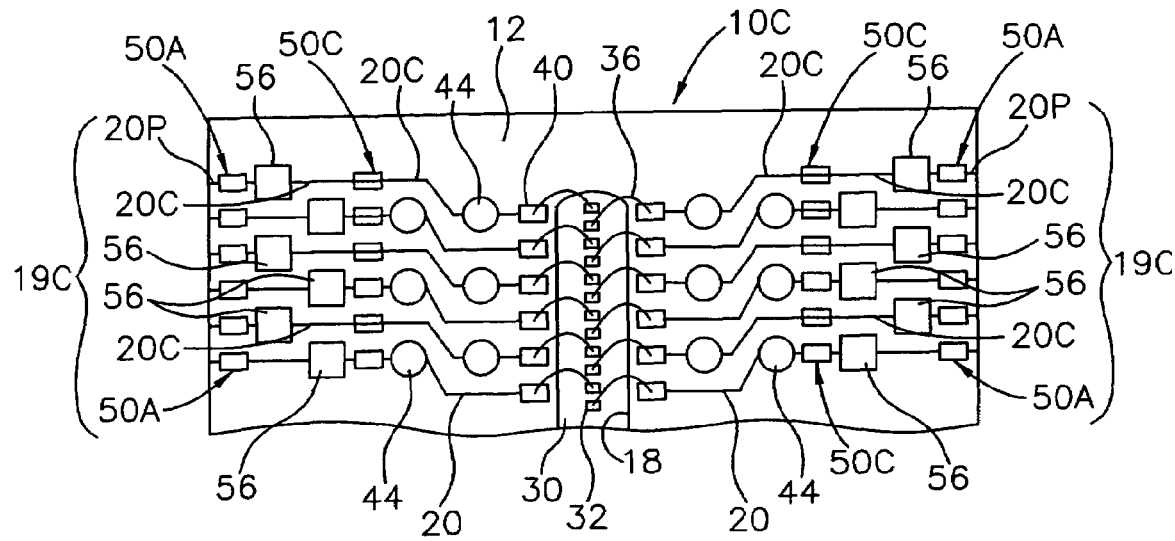
FIG. 4 is an enlarged cross sectional view equivalent to FIG. 3 illustrating adjustment circuitry on an alternate embodiment component having adjustable capacitance characteristics.

Referring to FIG. 4, a cross section equivalent to FIG. 3, of an alternate embodiment component 10C is illustrated. The component 10C is constructed substantially as previously described for component 10 (FIG. 1), and includes essentially the same elements including adjustment circuitry 19C. However, in this embodiment the adjustment circuitry 19C also includes capacitors 56 in electrical communication with the conductors 20 and the terminal contact bonding pads 44. In addition, the adjustment circuitry 19C includes programmable links 50C in electrical communication with the capacitors 56.

The programmable links 50C can comprise laser fuses, current fuses, laser anti-fuses or current anti-fuses, substantially as previously described for programmable links 50A, 50B in FIG. 3. The capacitors 56 and programmable links 50C allow extra capacitance to be added or "trimmed" into the conductors 20. The capacitors 56 and programmable links 50C permit capacitance to be added to the conductive paths through the terminal contacts 28 (FIG. 1) such that the capacitance of individual terminal contacts 28, and the capacitance of selected groups of the terminal contacts 28, can be adjusted and/or matched. For example, the terminal contacts 28 representing matching input/output pin groups for the component 10C can be matched.

In FIG. 4, the conductors having added capacitance are designated 20C. These conductors 20C are in electrical communication with a programmable link 50C in the first state (short) such that electrical communication with a capacitor 56 is maintained. The other conductors 20 are in electrical communication with a programmable link 50C in the second state (open) such that there is no electrical communication with a capacitor 56.

In the illustrative embodiment, the capacitors 56 and the programmable links 50C are located proximate to the terminal contact bonding pads 44, and are outside of the conductive paths between the terminal contact bonding pads 44 and the die 30. The capacitors 56 can comprise conductive plates separated by dielectric layers configured to provide a desired capacitance C. The capacitors 56 can be constructed using techniques that are known in the art, such as by deposition and patterning of metal and dielectric layers. Alternately, the capacitors 56 can comprise surface mount devices that are commercially available from various manufacturers. The value of the capacitance C of each capacitor 56 can be selected as required, with from micro farads ($\mu$F) to pico farads (pF) being representative. In addition to matching the capacitance of the conductive paths for the terminal contacts 28, the capacitors can also be used as by-pass filters for filtering transient voltages, power supply noise and spurious signals.

Figure 5:
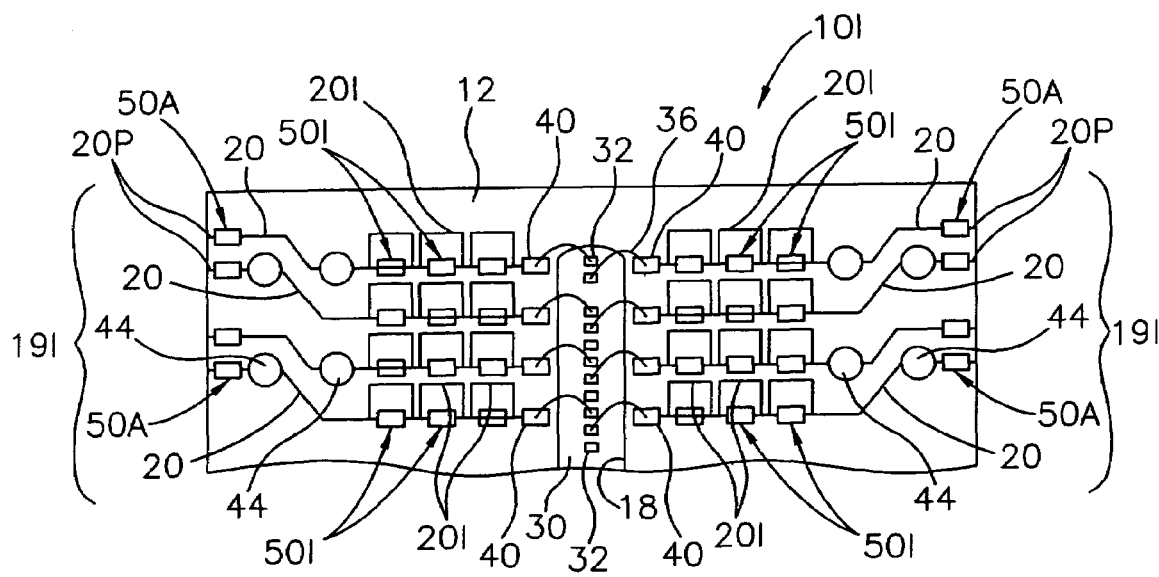
FIG. 5 is an enlarged cross sectional view equivalent to FIG. 3 illustrating adjustment circuitry on an alternate embodiment component having adjustable inductance characteristics.

Referring to FIG. 5, a cross sectional equivalent to FIG. 3, of an alternate embodiment component 10I is illustrated. The component 10I is constructed substantially as previously described for component 10 (FIG. 1), and includes essentially the same elements including adjustment circuitry 19I. However, the adjustment circuitry 19I also includes inductance conductors 20I in electrical communication with the conductors 20, and with the terminal contact bonding pads 44. In addition, the inductance conductors 20I are in electrical communication with programmable links 50I. Each inductance conductor 20I and associated programmable link 50I forms an adjustable conductive loop that can be either by-passed, or added, depending on the state of the programmable link 50I.

The programmable links 50I can comprise laser fuses, current fuses, laser anti-fuses or current anti-fuses, substantially as previously described for programmable links 50A, 50B in FIG. 3. The inductance conductors 20I and programmable links 50I allow extra inductance and resistance to be added or "trimmed" into the conductors 20 In FIG. 50, the inductance conductors 20I in electrical communication with the programmable links 50I in the second state (open) are activated, whereas the inductance conductors 20I in electrical communication with the programmable links in the first state (short) are bypassed.

In FIG. 5, the inductance conductors 20I and programmable links 50I are located between the terminal contact bonding pads 44 and the wire bonding pads 40. In addition, each conductor 20 includes three separate inductance conductors 20I and programmable links 50I. However, this arrangement is merely exemplary and other arrangements are possible.

Figure 6A:
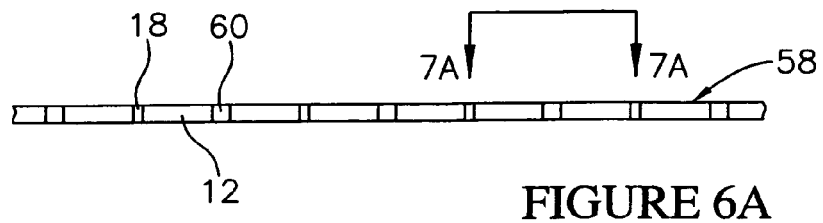
FIGS. 6A-6F are schematic cross sectional views illustrating steps in a method for fabricating the semiconductor component.

Referring to FIGS. 6A-6F, steps in a method for fabricating the component 10, 10C or 10I are illustrated. As shown in FIG. 6A, a panel 58 containing multiple substrates 12 is initially provided. The panel 58 is similar in function to a semiconductor leadframe, permitting the fabrication of multiple components 10, 10C or 10I at the same time.

As shown in FIG. 7A, the panel 58 includes circular indexing openings 62 proximate to the longitudinal edges thereof. The indexing openings 62 permit the panel 58 to be handled by automated transfer mechanisms associated with chip bonders, wire bonders, molds, and trim machinery. In addition, the panel 58 includes elongated separation openings 60 which facilitate singulation of the substrates 12 on the panel 58 into separate components 10, 10C or 10I. The panel 58 also includes a wire bonding opening 18 for each substrate 12. If desired, the panel 58 can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

Figure 6B:
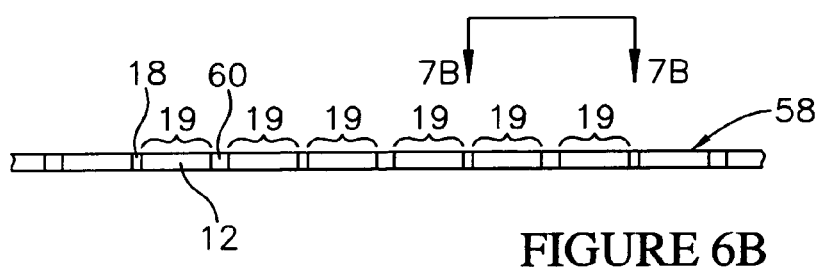

Next, as shown in FIG. 6B, the adjustment circuitry 19 is formed on the substrate 12. As shown in FIG. 7B, the adjustment circuitry 19 includes the conductors 20 and the programmable links 50A, 50B which are laid out substantially as previously described and shown in FIG. 3. In addition, the adjustment circuitry 19 includes the terminal contact bonding pads 44, and the wire bonding pads 40 in electrical communication with the conductors 20.

The conductors 20 can comprise a highly conductive metal layer, which is blanket deposited onto the panel 58 (e.g., electroless or electrolytic plating), and then etched in required patterns. Alternately, an additive process, such as electroless deposition through a mask, can be used. Suitable metals include copper, aluminum, titanium, tungsten, tantalum, platinum, molybdenum, cobalt, nickel, gold, and iridium.

The terminal contact bonding pads 44, and the wire bonding pads 40 can be formed at the same time, and using the same process, as for the conductors 20. In addition, the non-oxidizing layers 46 (FIGS. 3C, 3D) can be formed on the terminal contact bonding pads 44, and the wire bonding pads 40 using a plating process, such as electrolytic deposition. As shown in FIG. 7B, plating buses 64 can be used to electrically connect the conductors 20 for performing the plating process. These plating buses 64 will be trimmed away during the singulating step to be hereinafter described.

The programmable links 50A, 50B can be formed at the same time and using the same process as for the conductors 20. For example, the programmable links 50A, 50B can comprise segments of the conductors 20 formed by etching a blanket deposited layer using an etch mask, or by depositing metal in a required pattern using a deposition mask. Alternately, the programmable links 50A, 50B can comprise surface mounted devices placed in electrical communication with the conductors 20.

Following formation of the adjustment circuitry 19 the solder mask 24 (FIG. 3B), and the solder mask 26 (FIG. 2) can be formed. The solder mask 24 includes the openings 48 (FIGS. 3C and 3D) for the terminal contact bonding pads 40, the wire bonding pads 44 and the programmable links 50A, 50B. The solder mask 26 includes a die sized opening on the die attach area 22 (FIG. 2). The solder masks 24, 26 can comprise a photoimageable dielectric material, such as a negative or positive tone resist. One suitable resist is commercially available from Taiyo America, Inc., Carson City, Nev. under the trademark "PSR-4000". The "PSR-4000" resist can be mixed with an epoxy such as epoxy "720" manufactured by Ciba-Geigy (e.g., 80% PSR-4000 and 20% epoxy "720"). Another suitable resist is commercially available from Shipley under the trademark "XP-9500".

Referring to FIG. 7C, the adjustment circuitry 19C can be configured as previously described and shown in FIG. 4, with capacitors 56 and programmable links 50C. The capacitors 56 can comprise etched or deposited metal and dielectric layers formed substantially as previously described for the conductors 20. Alternately, the capacitors 56 can comprise surface mounted devices placed in electrical communication with the conductors 20. The programmable links 50C can be formed substantially as previously described for programmable links 50A, 50B.

Referring to FIG. 7D, the adjustment circuitry 19I can also be configured as previously described and shown in FIG. 5, with inductance conductors 20I and programmable links 50I. The inductance conductors 20I can comprise etched or deposited metal layers formed substantially as previously described for the conductors 20. The programmable links 50I can be formed substantially as previously described for programmable links 50A, 50B.

Figure 6C:
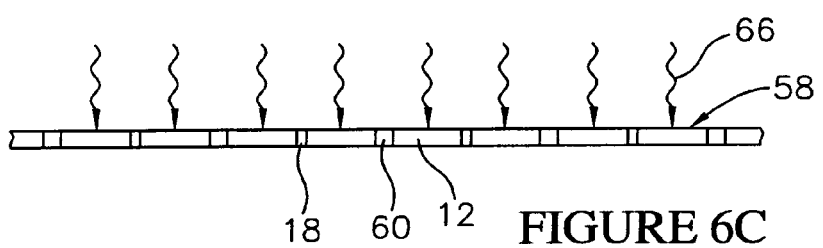

Referring to FIG. 6C, following formation of the adjustment circuitry 19, a laser beam 66 can be used to place selected programmable links 50A, 50B (FIG. 7B), 50C (FIG. 7C) or 50I (FIG. 7D), in the open state such that no current can be transmitted therethrough. Suitable laser systems for laser severing the breakable segments 52 (FIG. 3E) of the programmable links 50A, 50B are manufactured by Electro Scientific, Inc., of Portland, Oreg. as well as others.

Although the programmable links 50A, 50B, 50C, 50I are illustrated as being laser fuses, it is to be understood that these programmable links can also be configured as laser anti-fuses. In this case the laser beam 66 would be used to place selected programmable links in the short state, such that current can be conducted therethrough.

Figure 6D:
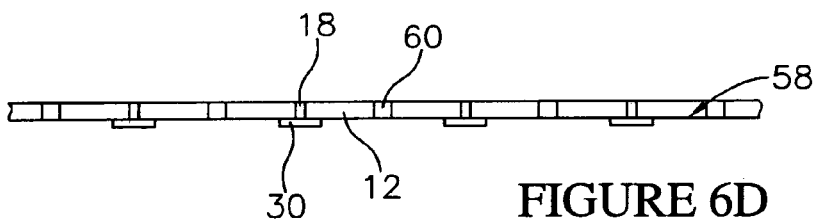

Next, as shown in FIG. 6D, the die 30 can be attached to the substrate 12 using conventional adhesives and die attach systems. In addition, the die 30 can be wire bonded to the wire bonding pads 40 (FIG. 3) using conventional wire bonding equipment.

Figure 6E:
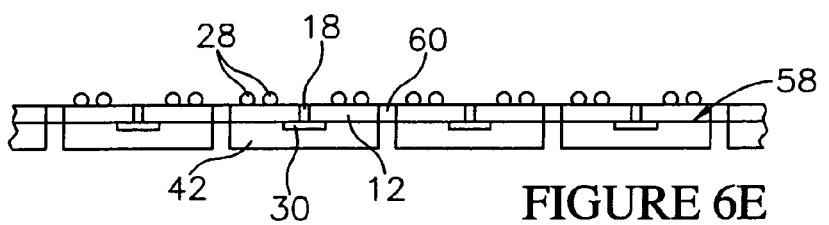

Next, as shown in FIG. 6E, the die encapsulant 42 can be formed on the die 30. The die encapsulant 42 can comprise a deposited or molded polymer. For example, the die encapsulant 42 can comprise a Novolac based epoxy formed in a desired shape using a transfer molding process, and then cured using an oven. For simplicity, in FIG. 6E, the wire bond encapsulant 38 is not shown. However, the wire bond encapsulant 38 can be formed using a suitable technique such as dispensing and curing a glob top polymer. As also shown in FIG. 6E, the terminal contacts 28 can be formed on the terminal contact bonding pads 44 using a bonding process, such as solder reflow of pre-formed balls, or a deposition process such as electroless deposition of metal bumps.

Figure 6F:
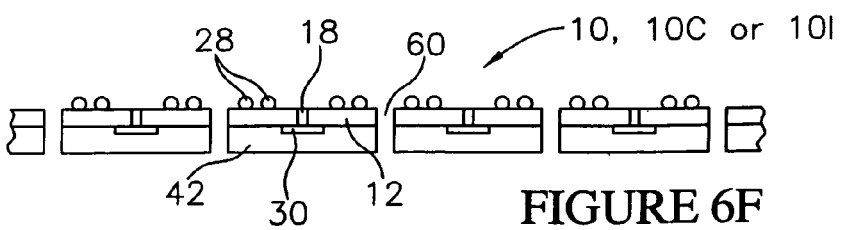

Next, as shown in FIG. 6F, a singulation step can be performed to singulate the components 10, 10C or 10I from the panel 58. The singulation step can be performed using a saw, a shear or another singulation apparatus. The singulation step also trims the plating buses 64 (FIG. 7B) such that the conductors 20 are no longer electrically connected to one another.

Figure 8A:
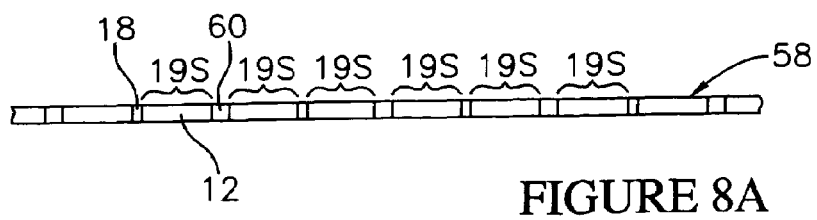
FIGS. 8A and 8B are schematic cross sectional views equivalent to FIGS. 6B and 6C respectively, illustrating an alternate embodiment of the fabrication method wherein electronic signals are utilized to program current-type programmable links.

Referring to FIGS. 8A-8B and 9A-9B, an alternate embodiment of the fabrication method illustrated in FIGS. 6A-6F is illustrated. As shown in FIG. 8A, an adjustment circuit 19S is formed on the substrate 12, substantially as previously described and shown in FIG. 6 for adjustment circuit 19. However, the adjustment circuit 19S includes programmable links 50S (FIG. 9A) configured as current fuses, or alternately programmable links 50AF configured as anti-fuses.

Figure 9A:
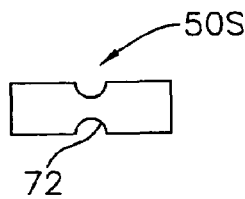
FIG. 9A is a schematic plan view of a programmable link in the form of a current fuse configured for use with the fabrication method of FIGS. 8A and 8B.
Figure 9B:
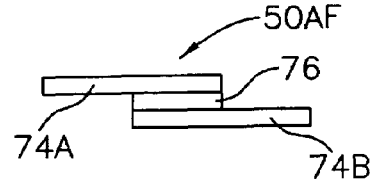
FIG. 9B is a schematic cross sectional view of a programmable link in the form of an anti-fuse configured for use with the fabrication method of FIGS. 8A and 8B.

As shown in FIG. 9A, each programmable link 50S includes a necked down portion 72 (FIG. 9A) configured to blow, and form an open circuit upon application of a sufficient current. As shown in FIG. 9B, each programmable link 50AF includes a pair of conductive plates 74A, 74B separated by a dielectric layer 76. Upon application of a sufficient current, the dielectric layer 76 breaks down, such that electrical communication is established between the conductive plates 74A, 74B and a short circuit is formed. With the programmable link 50AF configured as an anti-fuse the same results can be achieved as with a fuse, provided the state of the link (open or short) is opposite to that of the fuse.

Figure 8B:
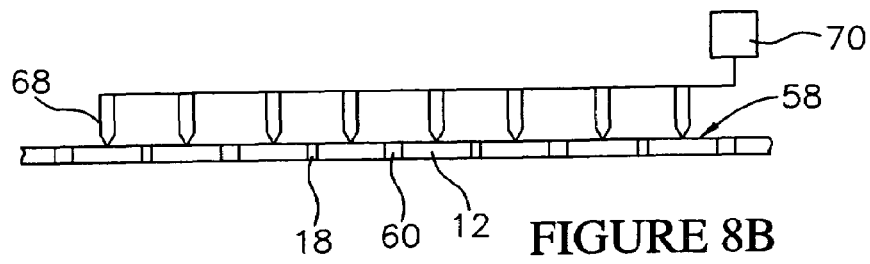

As shown in FIG. 8B, a programming circuit 70 is configured to apply the current signals necessary to place the programmable links 50S or 50AF in the required state (i.e., open for programmable link 50S or short for programmable link 50AF). In addition, electrical connectors 68 such as "POGO PINS" establish electrical communication between the programming circuit 70 and the programmable links 50S or 50AF. The electrical connectors can be constructed to electrically engage the terminal contact bonding pads 44 (FIG. 3), the wire bonding pads 40 (FIG. 3) or other connection points on the adjustment circuit 19S.

Figure 10A:
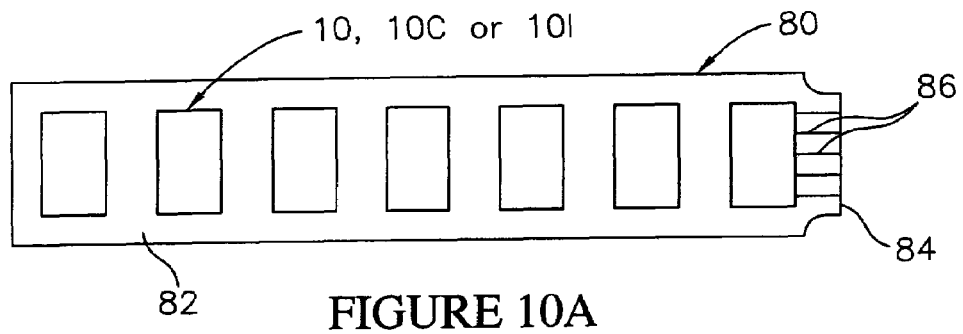
FIG. 10A is a schematic plan view of a multi chip module system constructed using components constructed in accordance with the invention.
Figure 10B:
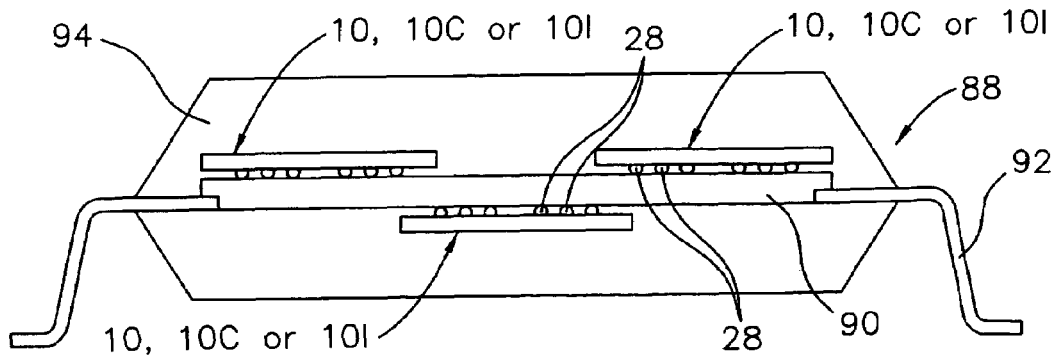
FIG. 10B is a schematic cross sectional view of a system in a package constructed using components constructed in accordance with the invention.

Referring to FIGS. 10A and 10B, electronic systems constructed using components 10, 10C, 10I fabricated in accordance with the invention are illustrated. In general, the components 10, 10C, 10I can be used in any system in which semiconductor components as previously defined are used.

In FIG. 10A, a multi chip module system 80 includes a module substrate 82 having an edge connector 84, and a plurality of conductors 86 in electrical communication with the edge connector 84. The components 10, 10C, 10I can be flip chip mounted to the module substrate 82, with the terminal contacts 28 (FIG. 1) thereon in electrical communication with the conductors 86.

In FIG. 10B, a system in a package (SIP) 88 is constructed with one or more components 10, 10C, 10I. This type of package is also referred to as a multi chip module MCM package. The system in a package (SIP) 88 can be configured to perform a desired function such as micro processing. The system in a package (SIP) 88 includes a substrate 90 having terminal leads 92. The components 10, 10C, 10I can be flip chip mounted to the substrate 90, with the terminal contacts 28 thereon in electrical communication with the terminal leads 92. The system in a package (SIP) 88 also includes a package body 94 encapsulating the components 110, 10C, 10I and the substrate 90.

Thus the invention provides improved adjustable semiconductor components, methods for fabricating the components, and systems incorporating the component. While the invention has been described with reference to certain preferred embodiments, as will be apparent to those skilled in the art, certain changes and modifications can be made without departing from the scope of the invention as defined by the following claims.

What is claimed is:

1. A method for fabricating a semiconductor component comprising:

providing a substrate, a semiconductor die on the substrate, a plurality of terminal contacts on the substrate, and a plurality of conductors on the substrate in electrical communication with the die and the terminal contacts;

providing at least one first programmable link on the substrate in electrical communication with a conductor configured to perform a first function of adjusting an electrical characteristic of the conductor;

providing a plurality of second programmable links on the substrate in electrical communication with the conductors configured to perform a second function of adjusting an input/output configuration of the terminal contacts;

adjusting the electrical characteristic of the conductor using the first programmable link; and adjusting the input/output configuration of the terminal contacts using the second programmable links.

2. The method of claim 1 wherein the electrical characteristic comprises capacitance and the adjusting the electrical characteristic step adds capacitance to the conductor.

3. The method of claim 1 wherein the electrical characteristic comprises inductance and the adjusting the electrical characteristic step adds inductance to the conductor.

4. The method of claim 1 wherein the first programmable link is configured to adjust a physical characteristic of the conductor during the adjusting the electrical characteristic step.

5. The method of claim 1 wherein the first programmable link is in electrical communication with a capacitor and the adjusting the electrical characteristic step connects the capacitor to the conductor.

6. The method of claim 1 wherein the first programmable link is in electrical communication with an inductance element and the adjusting the electrical characteristic step connects the inductance element to the conductor.

7. The method of claim 1 wherein the first programmable link is in electrical communication with a conductive loop which adds inductance to the conductor during the adjusting the electrical characteristic step.

8. The method of claim 1 wherein the adjusting the input/output configuration step adjusts the input/output configuration of the terminal contacts to a configuration of the die.

9. The method of claim 1 wherein the adjusting the electrical characteristic step trims the conductor.

10. The method of claim 1 wherein the adjusting the input/output configuration step can be performed to customize the input/output configuration to a particular type of die.

* * * * *